United States Patent
Yamauchi et al.

(10) Patent No.: US 9,633,873 B2
(45) Date of Patent: Apr. 25, 2017

(54) ELECTRONIC DEVICE

(71) Applicant: TAIYO YUDEN CO., LTD., Tokyo (JP)

(72) Inventors: Motoi Yamauchi, Tokyo (JP); Osamu Kawachi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 167 days.

(21) Appl. No.: 14/326,071

(22) Filed: Jul. 8, 2014

(65) Prior Publication Data

US 2015/0036304 A1  Feb. 5, 2015

(30) Foreign Application Priority Data

Jul. 31, 2013 (JP) .................. 2013-159763

(51) Int. Cl.
*H05K 7/00* (2006.01)
*H01L 21/56* (2006.01)
(Continued)

(52) U.S. Cl.
CPC ............ *H01L 21/561* (2013.01); *H01L 24/95* (2013.01); *H03H 9/1007* (2013.01); *H03H 9/1085* (2013.01); *H05K 1/0216* (2013.01); *H01L 2224/16225* (2013.01); *H01L 2224/32225* (2013.01); *H01L 2224/73204* (2013.01); *H01L 2924/12042* (2013.01);
(Continued)

(58) Field of Classification Search
CPC ....... H01L 2924/00; H01L 2224/16225; H01L 2224/32225; H01L 2224/73204; H01L 2924/12042; H01L 2924/15787; H01L 2924/181; H01L 21/561; H01L 24/95; H01L 2924/15174; H03H 2009/0019; H03H 9/02913
USPC ................ 361/760, 764, 783, 816, 766, 767
See application file for complete search history.

(56) References Cited

U.S. PATENT DOCUMENTS 9,165,849 B2 * 10/2015 Hatanaka .............. H01L 23/295
2002/0043899 A1 * 4/2002 Kishimoto ........... H03H 9/0576
310/348
(Continued)

FOREIGN PATENT DOCUMENTS

JP  2003-347483 A   12/2003
JP  2006-513564 A    4/2006

OTHER PUBLICATIONS

Chinese Office Action dated Aug. 2, 2016, in a counterpart Chinese patent application No. 201410366595.2.

*Primary Examiner* — Yuriy Semenenko
(74) *Attorney, Agent, or Firm* — Chen Yoshimura LLP

(57) ABSTRACT

An electronic device includes: a wiring substrate; a plurality of device chips that are flip-chip mounted on an upper surface of the wiring substrate through bumps, have gaps which expose the bumps between the device chips and the upper surface of the wiring substrate, and include at least one device chip that has a substrate having a thermal expansion coefficient more than a thermal expansion coefficient of the wiring substrate; a junction substrate that is joined to the plurality of device chips, and has a thermal expansion coefficient equal to or less than the thermal expansion coefficient of the substrate included in the at least one device chip; and a sealer that covers the junction substrate, and seals the plurality of device chips.

11 Claims, 12 Drawing Sheets

(51) Int. Cl.
*H03H 9/10* (2006.01)
*H01L 23/00* (2006.01)
*H05K 1/02* (2006.01)
*H05K 1/14* (2006.01)
*H05K 3/28* (2006.01)
*H05K 3/30* (2006.01)
*H05K 3/34* (2006.01)
*H03H 9/00* (2006.01)
*H03H 9/02* (2006.01)

(52) U.S. Cl.
CPC ............... *H01L 2924/15174* (2013.01); *H01L 2924/15787* (2013.01); *H01L 2924/181* (2013.01); *H03H 9/02913* (2013.01); *H03H 2009/0019* (2013.01); *H05K 1/0209* (2013.01); *H05K 1/0243* (2013.01); *H05K 1/141* (2013.01); *H05K 3/284* (2013.01); *H05K 3/303* (2013.01); *H05K 3/3436* (2013.01); *H05K 2201/0305* (2013.01); *H05K 2201/049* (2013.01); *H05K 2201/068* (2013.01); *H05K 2201/1056* (2013.01); *H05K 2201/10068* (2013.01); *H05K 2201/10371* (2013.01); *H05K 2201/10537* (2013.01); *H05K 2201/10674* (2013.01); *H05K 2203/1316* (2013.01)

(56) References Cited

U.S. PATENT DOCUMENTS

| | | | |
|---|---|---|---|
| 2005/0179126 A1 | 8/2005 | Ravi et al. | |
| 2006/0102374 A1 | 5/2006 | Heide | |
| 2006/0151203 A1 | 7/2006 | Krueger et al. | |
| 2008/0054439 A1* | 3/2008 | Malhan | H01L 23/49844 257/690 |
| 2009/0091904 A1* | 4/2009 | Hatanaka | H03H 9/1021 361/764 |
| 2009/0302970 A1* | 12/2009 | Hatano | H03H 9/0571 333/133 |
| 2010/0038122 A1 | 2/2010 | Sakinada et al. | |
| 2010/0066209 A1* | 3/2010 | Saitou | H03H 3/08 310/340 |
| 2010/0327431 A1 | 12/2010 | Touzelbaev et al. | |
| 2013/0113090 A1* | 5/2013 | Atsumi | H01L 24/33 257/676 |

* cited by examiner

ELECTRONIC DEVICE

CROSS-REFERENCE TO RELATED APPLICATION

This application is based upon and claims the benefit of priority of the prior Japanese Patent Application No. 2013-159763, filed on Jul. 31, 2013, the entire contents of which are incorporated herein by reference.

FIELD

A certain aspect of the present invention relates to an electronic device, e.g. to an electronic device in which a plurality of device chips are flip-chip mounted on a wiring substrate.

BACKGROUND

In recent years, downsizing and cost reduction of an electronic device are demanded. For such a demand, there has been developed a technique for flip-chip mounting a plurality of device chips on a wiring substrate through bumps and sealing the device chips (see e.g. Japanese Patent Application Publication No. 2003-347483 and Japanese National Publication of International Patent Application No. 2006-513564).

When the device chips are sealed with a resin, for example, airtightness and heat dissipation deteriorate and hence reliability is damaged. Moreover, when a gap which exposes the bumps exists between the device chips and the wiring substrate, since respective thermal expansion coefficients of the wiring substrate, the device chips and a sealing unit are different from each other, a stress occurs in the bumps corresponding to the respective device chips and hence reliability is damaged.

SUMMARY OF THE INVENTION

According to an aspect of the present invention, there is provided an electronic device including: a wiring substrate; a plurality of device chips that are flip-chip mounted on an upper surface of the wiring substrate through bumps, have gaps which expose the bumps between the device chips and the upper surface of the wiring substrate, and include at least one device chip that has a substrate having a thermal expansion coefficient more than a thermal expansion coefficient of the wiring substrate; a junction substrate that is joined to the plurality of device chips, and has a thermal expansion coefficient equal to or less than the thermal expansion coefficient of the substrate included in the at least one device chip; and a sealer that covers the junction substrate, and seals the plurality of device chips.

DETAILED DESCRIPTION

A description will be given of embodiments with reference to the drawings.

First Embodiment

Figure 1A:
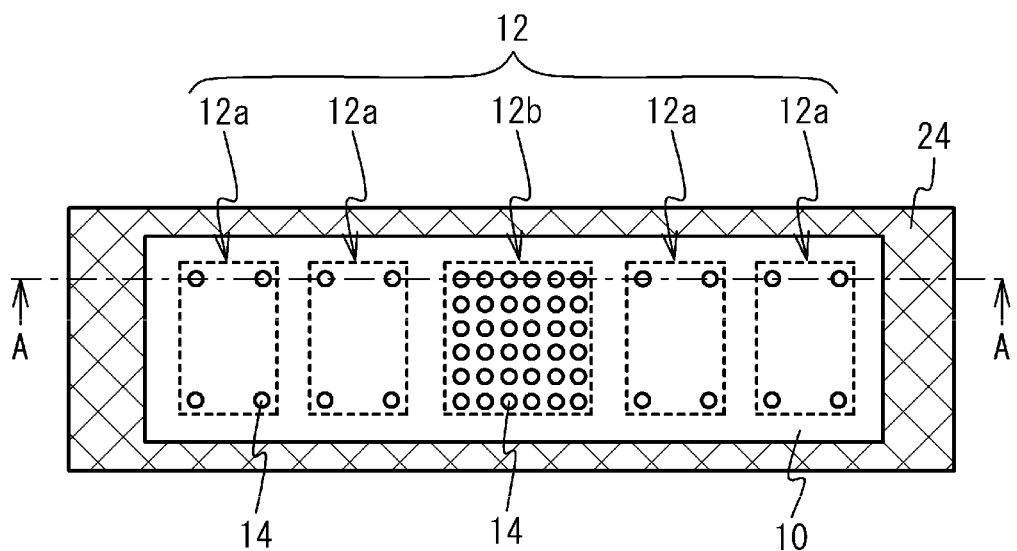
FIG. 1A is a top view illustrating an electronic device according to a first embodiment.
Figure 1B:
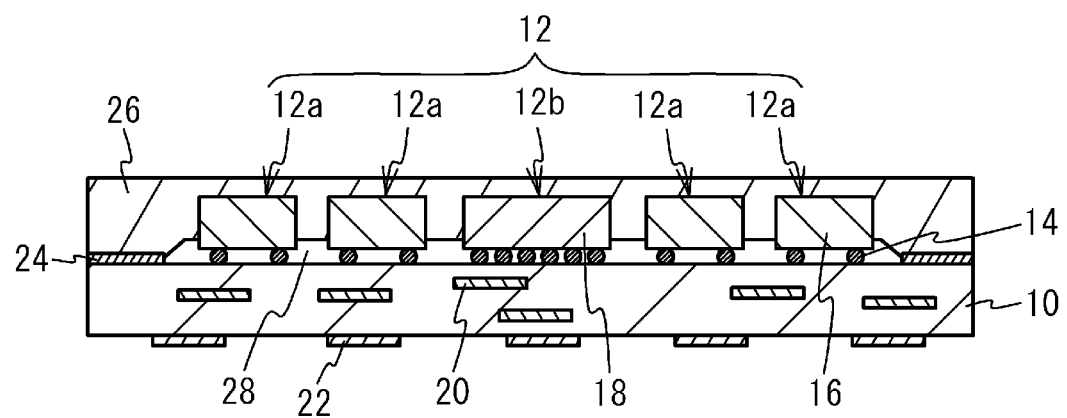
FIG. 1B is a cross-sectional view taken along a line A-A in FIG. 1A.

FIG. 1A is a top view illustrating an electronic device according to a first embodiment, and FIG. 1B is a cross-sectional view taken along a line A-A in FIG. 1A. Here, FIG. 1A illustrates bumps 14 by penetrating a sealing unit 26 and a plurality of device chips 12. As illustrated in FIGS. 1A and 1B, the device chips 12 are flip-chip mounted via bumps 14 on an upper surface of a wiring substrate 10 composed of an insulator, such as ceramic. A gap 28 is formed between the upper surface of the wiring substrate 10 and the device chips 12, and the bumps 14 is exposed in the gap 28. Although the bumps 14 are composed of solder, for example, gold (Au) may be used as the bumps 14. The device chips 12 include a surface acoustic wave (SAW) device chip 12a and a semiconductor device chip 12b. The SAW device chip 12a is flip-chip mounted on the upper surface of the wiring substrate 10 through the bumps 14 located at four corners, for example. The semiconductor device chip 12b is flip-chip mounted on the upper surface of the wiring substrate 10 through the bumps 14 arranged in the shape of a lattice, for example.

The SAW device chip 12a includes a piezoelectric substrate 16 composed of a piezoelectric substance such as lithium tantalite (LiTaO$_3$; hereinafter referred to as "LT") or lithium niobate (LiNbO$_3$; hereinafter referred to as "LN"), and a metal film (not shown), such as an IDT (Interdigital Transducer) and an reflector, provided on a surface of the piezoelectric substrate 16 in a side opposite to the wiring substrate 10. The semiconductor device chip 12b includes a semiconductor substrate 18 composed of a semiconductor, such as silicon (Si) or gallium arsenide (GaAs).

Via-wirings 20 are provided in the inside of the wiring substrate 10. Although only the via-wirings 20 extending in a horizontal direction are illustrated in FIG. 1B, the via-wirings 20 extending in a vertical direction also exist. The device chips 12 are electrically connected to external terminals 22 provided on a lower surface of the wiring substrate 10, via the via-wirings 20.

A metal pattern 24 is provided on the upper surface of the wiring substrate 10 and in the outside of the device chips 12. The metal pattern 24 is annularly formed so as to surround the device chips 12. The sealing unit 26 for sealing the device chips 12 is formed by being connected to the metal pattern 24 and covering the device chips 12. The sealing unit 26 is composed of a metal, such as a solder. It is desirable that a metal having wettability suitable for a material which constitutes the sealing unit 26 is used for the metal pattern 24. For example, it is desirable that a metal having wettability suitable for the solder is used for the metal pattern 24.

According to the first embodiment, the device chips 12 which are flip-chip mounted on the upper surface of the wiring substrate 10 through the bumps 14 are sealed with the sealing unit 26 composed of the metal, as illustrated in FIG. 1B. Thus, since the device chips 12 are sealed with the sealing unit 26 composed of the metal, the airtightness and the heat dissipation of the device chips 12 can be improved, compared with a case where the resin is used as the sealing unit, for example. Therefore, the reliability can be improved.

Figure 2:
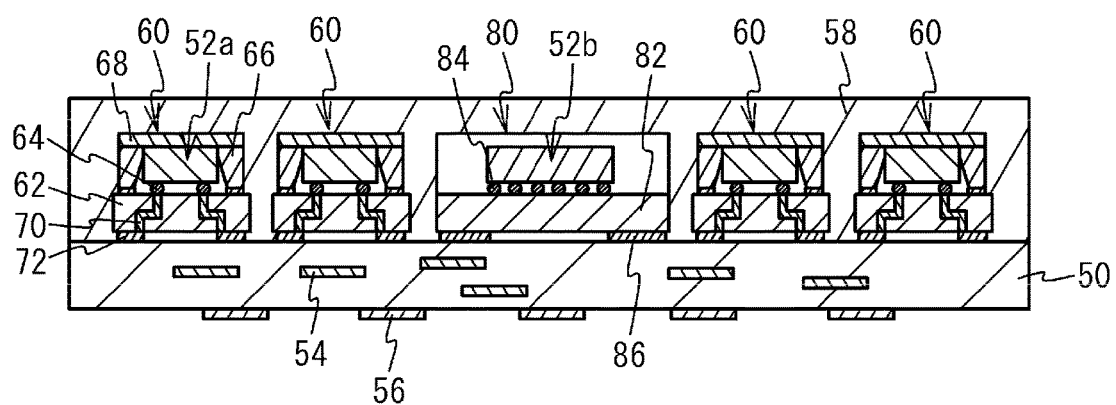
FIG. 2 is a cross-sectional view illustrating the electronic device according to a comparative example 1.

Moreover, according to the first embodiment, downsizing of the electronic device and reducing the height of the electronic device can be achieved. This effect is explained by comparing the electronic device of the first embodiment with an electronic device of a comparative example 1. FIG. 2 is a cross-sectional view illustrating the electronic device according to the comparative example 1. As illustrated in FIG. 2, the packages 60 and 80 which separately packed a SAW device chip 52a and a semiconductor device chip 52b, respectively, are mounted on an upper surface of a wiring substrate 50.

Each package 60 includes the SAW device chip 52a that is flip-chip mounted on the upper surface of a substrate 62 through bumps 64, and a sealing unit 66 and a lid 68 that seal the SAW device chip 52a. The SAW device chip 52a is electrically connected, through via-wirings 70 in a substrate 62, to external terminals 72 provided on a lower surface of the substrate 62. The package 80 includes the semiconductor device chip 52b flip-chip mounted on the upper surface of a substrate 82 through bumps 84. The semiconductor device chip 52b is electrically connected, through via-wirings (not shown) in the substrate 82, to external terminals 86 provided on a lower surface of the substrate 82. The SAW device chip 52a and the semiconductor device chip 52b are electrically connected, through the external terminals 72 and 86 and via-wirings 54 in the wiring substrate 50 (these elements are illustrated in only a horizontal direction and illustration in a perpendicular direction is omitted), to external terminals 56 provided on a lower surface of the wiring substrate 50.

A mold resin 58 is provided so as to cover the packages 60 and 80. Here, instead of the mold resin 58, a resinous top plate extending on the packages 60 and 80 may be provided.

According to the comparative example 1, the packages 60 and 80 which separately package the SAW device chip 52a and the semiconductor device chip 52b, respectively, are mounted on an upper surface of the wiring substrate 50. In such a configuration, enlargement of the electronic device and increasing the height of the electronic device occur. On the contrary, in the first embodiment, the plurality of device chips 12 are flip-chip mounted on the upper surface of the wiring substrate 10, as illustrated in FIG. 1B. It is understood that, with such a configuration, downsizing of the electronic device and reducing the height of the electronic device can be achieved, compared with FIG. 2 of the comparative example 1.

In the SAW device chip 12a, the gap for excitation of the acoustic wave by the IDT is formed. When a foreign body, moisture and so on adhere to the IDT, the change of a frequency characteristic and corrosion occur. Therefore, when the SAW device chips 12a are included in the device chips 12, it is desirable that the device chips 12 are flip-chip mounted on the upper surface of the wiring substrate 10 through the bumps 14 and are sealed with the sealing unit 26 composed of the metal, as mentioned in the first embodiment. Thereby, the gaps 28 for excitation of the acoustic wave by the IDT can be formed between the device chips 12 and the wiring substrate 10, as illustrated in FIG. 1B, the airtightness of the SAW device chips 12a can be improved, and the adhesion of the foreign body, the moisture and the like can be controlled.

The sealing unit 26 may be a metal other than the solder, and it is desirable that the sealing unit 26 is composed of the solder in consideration of the airtightness, an electric shield effect, easiness of the sealing, or the like. Also, the device chips 12 may include acoustic wave device chips other than the SAW device chips 12a. For example, the device chips 12 may include piezoelectric thin film resonator device chips of FBAR (Film Bulk Acoustic Resonator) or SMR (Solidly Mounted Resonator).

Second Embodiment

Figure 3A:
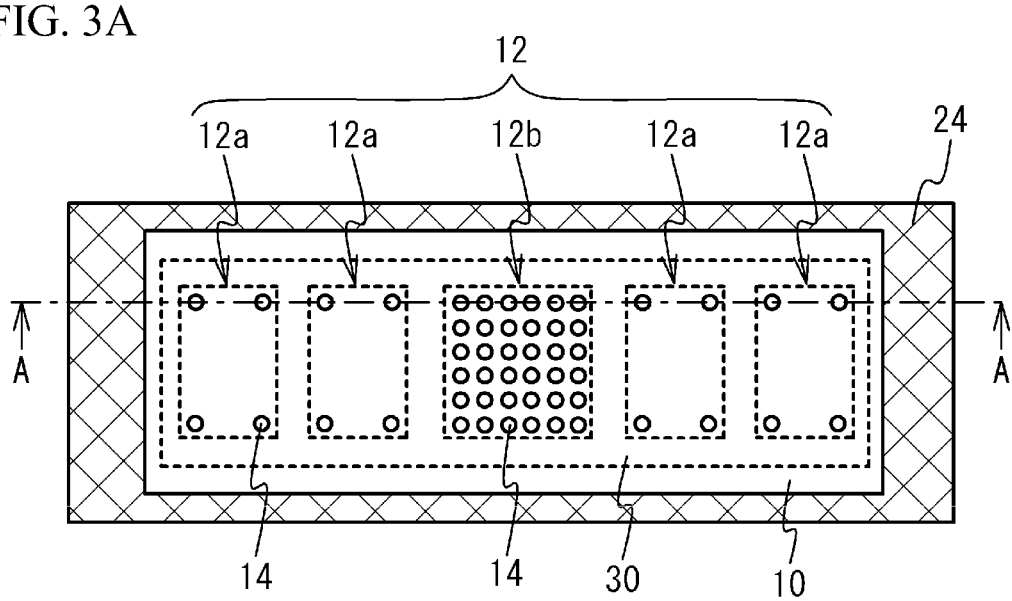
FIG. 3A is a top view illustrating an electronic device according to a second embodiment.
Figure 3B:
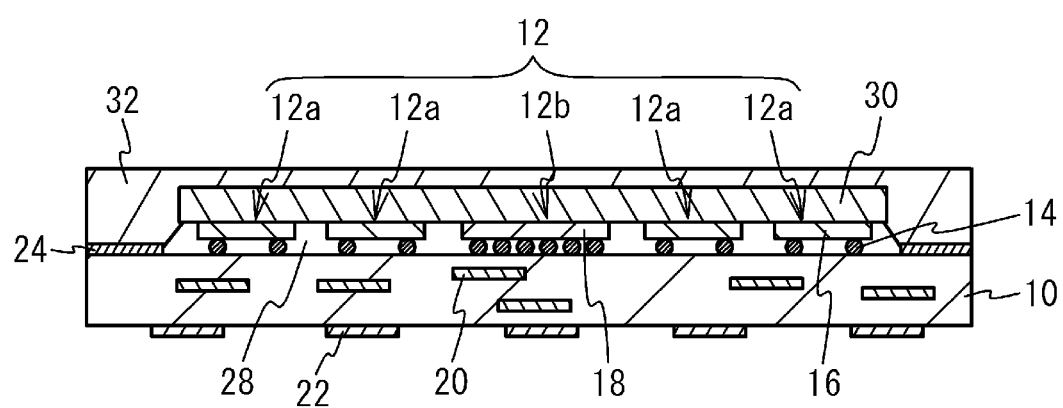
FIG. 3B is a cross-sectional view taken along a line A-A in FIG. 3A.

FIG. 3A is a top view illustrating the electronic device according to a second embodiment. FIG. 3B is a cross-sectional view taken along a line A-A in FIG. 3A. In FIG. 3A, the bumps 14 are illustrated by penetrating a sealing unit 32, a junction substrate 30, and the plurality of device chips 12. The device chips 12 includes the SAW device chips 12a and the semiconductor device chip 12b, as illustrated in FIGS. 3A and 3B. The wiring substrate 10 is composed of ceramics, such as HTCC (High Temperature Co-fired Ceramics), for example, and the piezoelectric substrate 16 of each SAW device chip 12a is composed of the LT, for example. Since a thermal expansion coefficient of the ceramics is about 6.5-7.5 ppm/° C., and the thermal expansion coefficient of the LT is about 10-16 ppm/° C., the piezoelectric substrate 16 of the SAW device chip 12a has a thermal expansion coefficient larger than that of the wiring substrate 10. That is, the SAW device chip 12a having the piezoelectric substrate 16 larger in the thermal expansion coefficient than the wiring substrate 10 is included in the device chips 12.

The junction substrate 30 is joined to the device chips 12 at surfaces of the device chips 12 on the back side of surfaces of the device chips 12 opposite to the wiring substrate 10. That is, the single junction substrate 30 is joined to the plurality of device chips 12. The junction substrate 30 has a form larger than a domain on which the device chips 12 are provided. It is desirable that the junction substrate 30 is joined to all the device chips 12 at the whole surfaces of the device chips 12 on the back side of surfaces of the device chips 12 opposite to the wiring substrate 10, but the junction substrate 30 may be joined to all the device chips 12 at parts of the surfaces of the device chips 12 on the back side of surfaces of the device chips 12 opposite to the wiring substrate 10. The junction substrate 30 has a thermal expansion coefficient equal to or less than the thermal expansion coefficient of the piezoelectric substrate 16 which is larger than that of the wiring substrate 10. When the piezoelectric substrate 16 is composed of the LT, for example, sapphire (5.0 ppm/° C.), silicon (2.3 ppm/° C.), glass (about 3 ppm/° C.), ceramics (about 6.5-7.5 ppm/° C.), LN (about 15-20 ppm/° C.), LT or the like can be used as the junction substrate 30. Here, a numerical value in each parenthesis is the thermal expansion coefficient.

The sealing unit 32 which seals the device chips 12 is provided so as to cover the junction substrate 30. The sealing unit 32 is composed of the metal such as the solder, for example, and an insulator, such as resin, may be used as the sealing unit 32. Since other configuration is the same as that of FIGS. 1A and 1B of the first embodiment, description thereof is omitted.

Figure 4A:
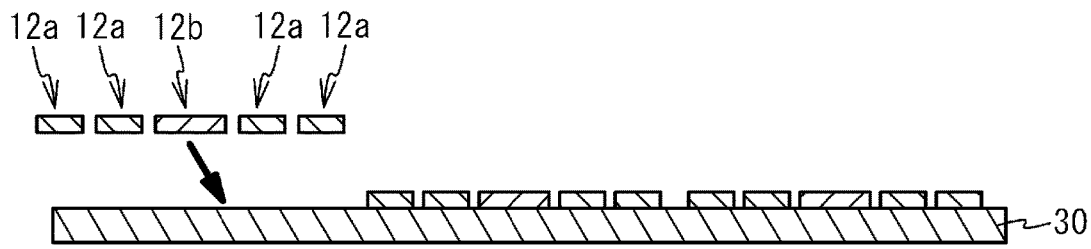
FIGS. 4A to 4D are cross-sectional views illustrating a manufacturing method of the electronic device according to the second embodiment.

A description will be given of a manufacturing method of the electronic device according to a second embodiment. FIGS. 4A to 4D are cross-sectional views illustrating the manufacturing method of the electronic device according to the second embodiment. As illustrated in FIG. 4A, the SAW device chips 12a and the semiconductor device chips 12b which are manufactured beforehand are joined to one surface of the junction substrate 30. An adhesive, such as resin, can be used for the junction, for example. Here, the thickness of the SAW device chips 12a and the semiconductor device chips 12b may be reduced before the SAW device chips 12a and the semiconductor device chips 12b are joined to the junction substrate 30. This is because the junction substrate 30 serves as a support substrate. By the reduction of the thickness, the thickness of the SAW device chips 12a and the semiconductor device chips 12b can be 20 μm. In this case, the junction substrate 30 is thicker than the SAW device chips 12a and the semiconductor device chips 12b, for example, and can be 130 μm.

Figure 4B:
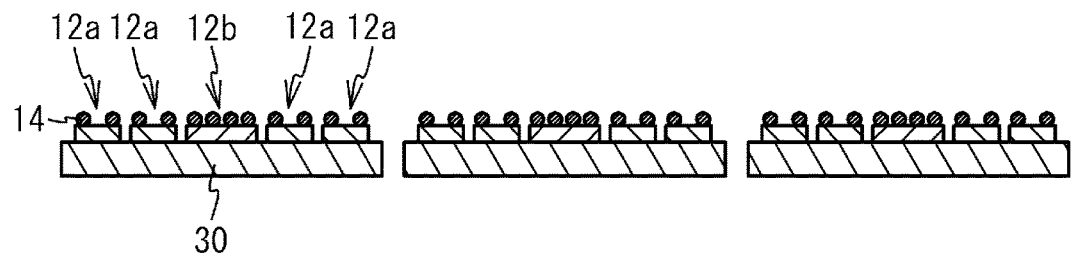

As illustrated in FIG. 4B, the bumps 14 are formed on the upper surfaces of the SAW device chips 12a and the semiconductor device chips 12b. Here, in FIG. 4A, the upper surfaces of the SAW device chips 12a and the semiconductor device chips 12b on which the bumps 14 are formed beforehand may be joined to the junction substrate 30. Then, the junction substrate 30 is divided into desired units. The division of the junction substrate 30 can be performed by using dicing, a laser, etching, or the like, for example.

Figure 4C:
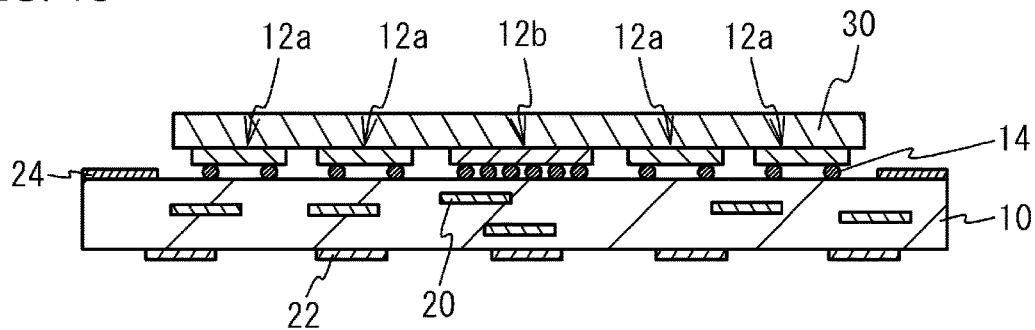

As illustrated in FIG. 4C, the SAW device chips 12a and the semiconductor device chip 12b joined to the junction substrate 30 are flip-chip mounted on the upper surface of the wiring substrate 10 prepared beforehand, by the use of the bumps 14.

Figure 4D:
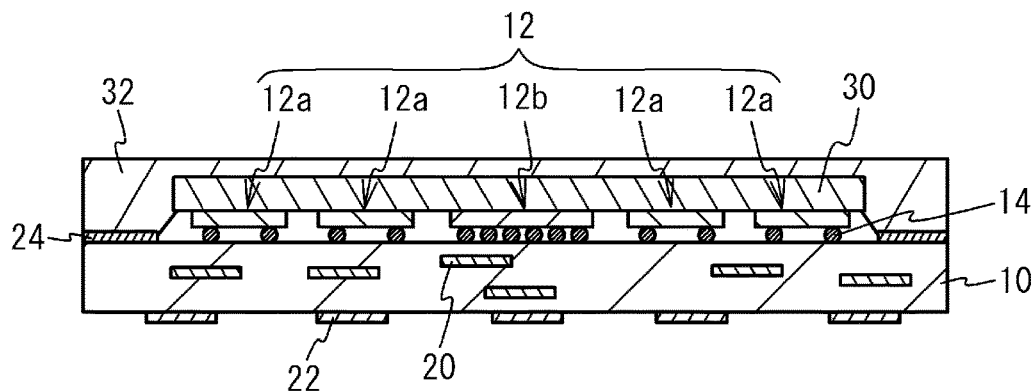

As illustrated in FIG. 4D, the sealing unit 32 is formed on the wiring substrate 10 so as to cover the junction substrate 30, and seals the device chips 12. The sealing unit 32 can be formed by arranging a solder sheet on the junction substrate 30 and heating the solder sheet at 270° C. The solder melted by heating the solder sheet is wettedly spread on the metal pattern 24 provided on the wiring substrate 10, then is solidified, and is joined to the metal pattern 24. Thereby, the sealing unit 32 which seals the device chips 12 is formed. The electronic device according to the second embodiment can be formed by including such a manufacturing process.

Figure 5A:
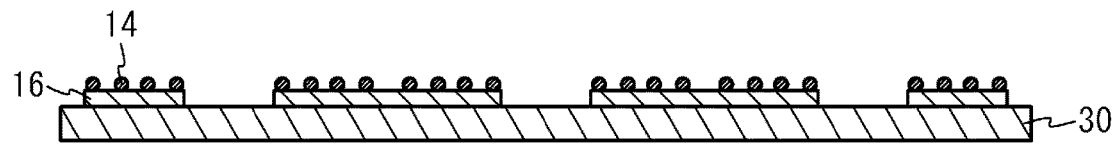
FIGS. 5A to 5D are cross-sectional views illustrating another manufacturing method of the electronic device according to the second embodiment.

Next, a description will be given of another manufacturing method of the electronic device according to the second embodiment. FIGS. 5A to 5D are cross-sectional views illustrating another manufacturing method of the electronic device according to the second embodiment. As illustrated in FIG. 5A, the piezoelectric substrates 16 on which metal films (not shown) of the SAW device chips, such as the IDT, and the bumps 14 are formed are joined to one surface of the junction substrate 30. For example, surface activation junction, junction by a resin, or metal junction by a metallic film formed on a junction surface can be used as the junction of the piezoelectric substrates 16.

Figure 5B:
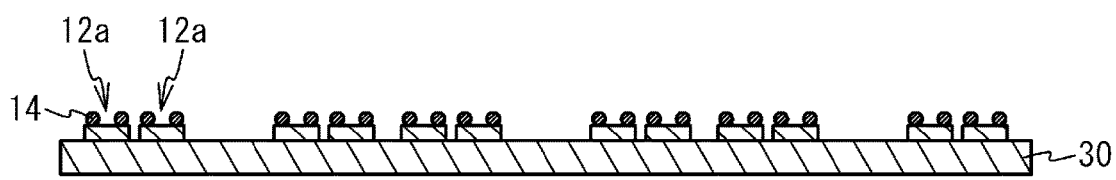
Figure 5C:
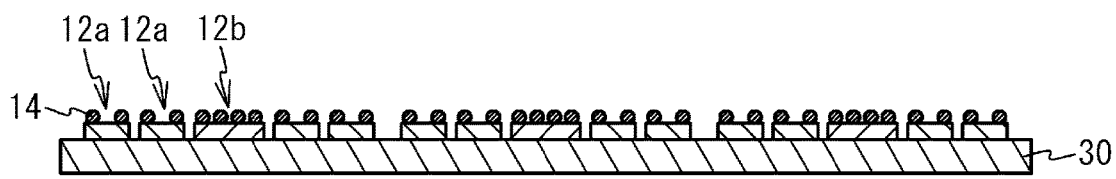
Figure 5D:
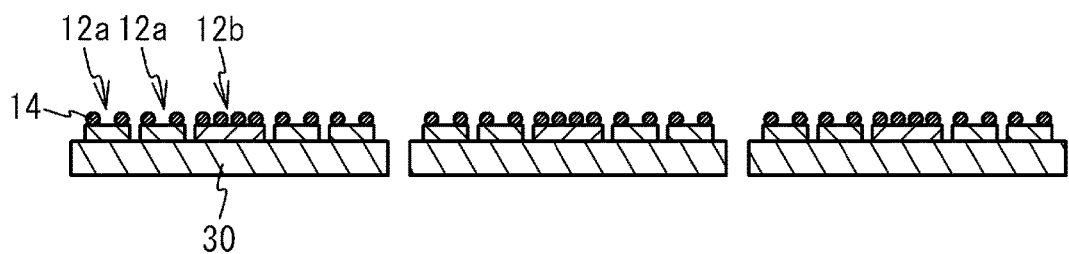

As illustrated in FIG. 5B, the piezoelectric substrates 16 are cut and separated into the SAW device chips 12a, respectively. The cutting of the piezoelectric substrates 16 can be performed using dicing, a laser, etching, or the like, for example. As illustrated in FIG. 5C, the semiconductor device chips 12b on which the bumps 14 are formed are joined to the junction substrate 30. As illustrated in FIG. 5D, the junction substrate 30 is divided into desired units. Then, the manufacturing process explained by FIGS. 4C and 4D is performed. The electronic device according to the second embodiment can be also formed by including such a manufacturing process.

In the first embodiment, since the device chips 12 are sealed with the sealing unit 26 composed of the metal, the airtightness and the heat dissipation can be improved. Since the thermal expansion coefficients of the wiring substrate 10, the SAW device chip 12a, the semiconductor device chip 12b and the sealing unit 26 differ from each other, the amounts of thermal expansion and contraction for all directions of a vertical, a horizontal, and a diagonal direction differ, respectively. When the wiring substrate 10 is ceramics (about 6.5-7.5 ppm/° C.), the piezoelectric substrate 16 of the SAW device chip 12a is the LT (about 10-16 ppm/° C.), and the sealing unit 26 is composed of the solder (about 20 ppm/° C.), the amount of thermal expansion and contraction of the SAW device chip 12a becomes large against the wiring substrate 10. Here, the numerical value in the parenthesis is the thermal expansion coefficient. Since the bumps 14 used for the flip-chip mounting are exposed to the gap 28 formed between the upper surface of the wiring substrate 10 and the device chips 12, a stress is applied to the bumps 14. As a result, there is concern that junction reliability of the bumps 14 is damaged. The second embodiment aims at the improvement of this.

Figure 6A:
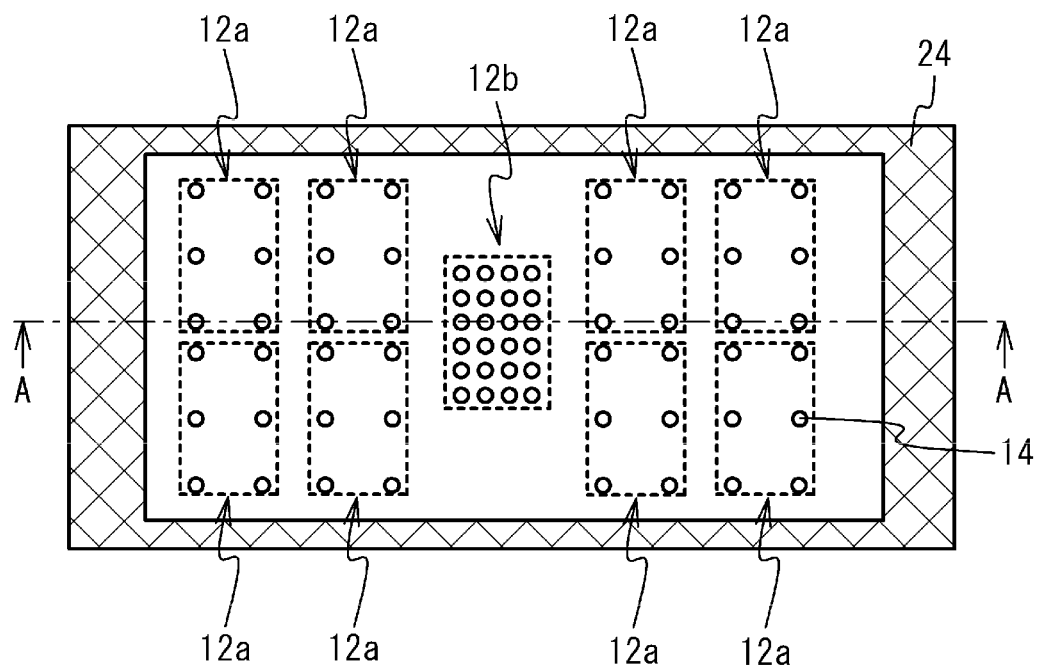
FIG. 6A is a top view illustrating the electronic device according to the first embodiment on which a simulation has been performed.
Figure 6B:
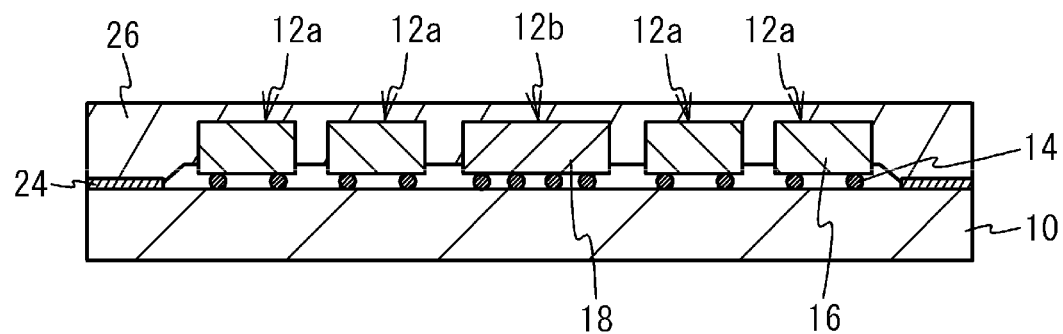
FIG. 6B is a cross-sectional view taken along a line A-A in FIG. 6A.
Figure 7A:
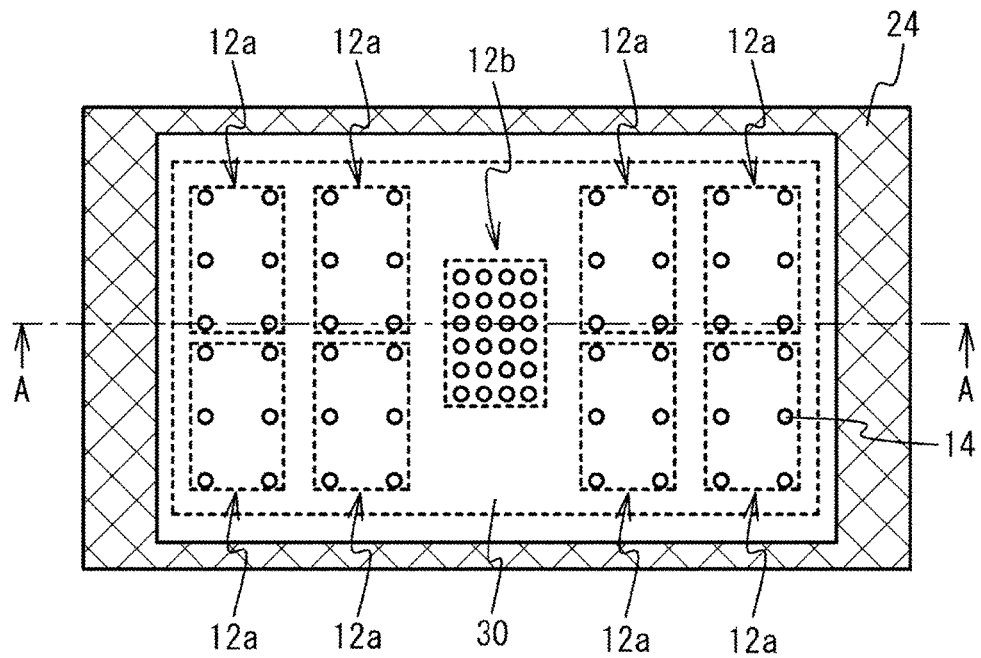
FIG. 7A is a top view illustrating the electronic device according to the second embodiment on which the simulation has been performed.
Figure 7B:
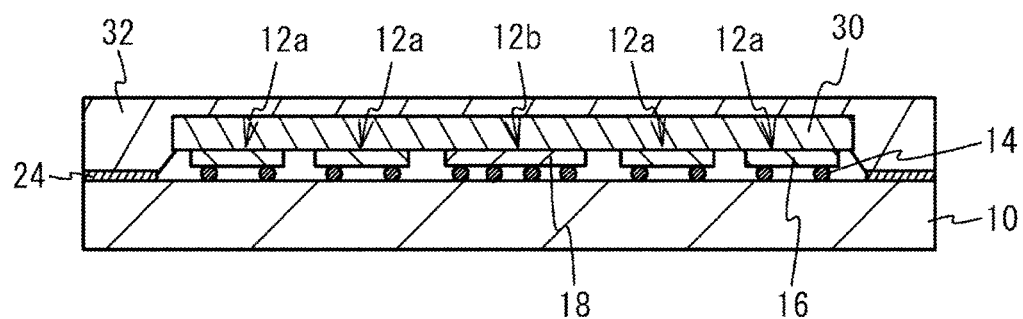
FIG. 7B is a cross-sectional view taken along a line A-A in FIG. 7A.

A description will be given of a simulation that has been performed on the electronic device according to the first and the second embodiments in order to explain the effect of the second embodiment. FIG. 6A is a top view illustrating the electronic device according to the first embodiment on which the simulation has been performed. FIG. 6B is a cross-sectional view taken along a line A-A in FIG. 6A. FIG. 7A is a top view illustrating the electronic device according to the second embodiment on which the simulation has been performed. FIG. 7B is a cross-sectional view taken along a line A-A in FIG. 7A.

As illustrated in FIGS. 6A and 6B, in the electronic device which has performed the simulation, eight SAW device chips 12a and one semiconductor device chip 12b are flip-chip mounted on the upper surface on the wiring substrate 10. Eight SAW device chips 12a are symmetrically arranged against one semiconductor device chip 12b every four SAW device chips. The SAW device chip 12a is flip-chip mounted by six bumps 14, and the semiconductor device chip 12b is flip-chip mounted by twenty-four bumps 14 arranged in the shape of a lattice. The piezoelectric substrate 16 of the SAW device chip 12a is an LT substrate of 150 μm in thickness. The semiconductor substrate 18 of the semiconductor device chip 12b is a Si substrate of 150 μm in thickness. The wiring substrate 10 is a ceramic substrate composed of the HTCC of 170 μm in thickness.

The bump 14 is a golden bump of 20 μm in thickness. The sealing unit 26 is a Sn—Ag solder.

As illustrated in FIGS. 7A and 7B, in the electronic device on which the simulation has been performed, the piezoelectric substrate 16 of the SAW device chip 12a is an LT substrate of 20 μm in thickness. The semiconductor substrate 18 of the semiconductor device chip 12b is a Si substrate of 20 μm in thickness. The junction substrate 30 is a sapphire substrate of 130 μm in thickness. The sealing unit 32 is a Sn—Ag solder. Other configuration is the same as that of FIGS. 6A and 6B.

Figure 8:
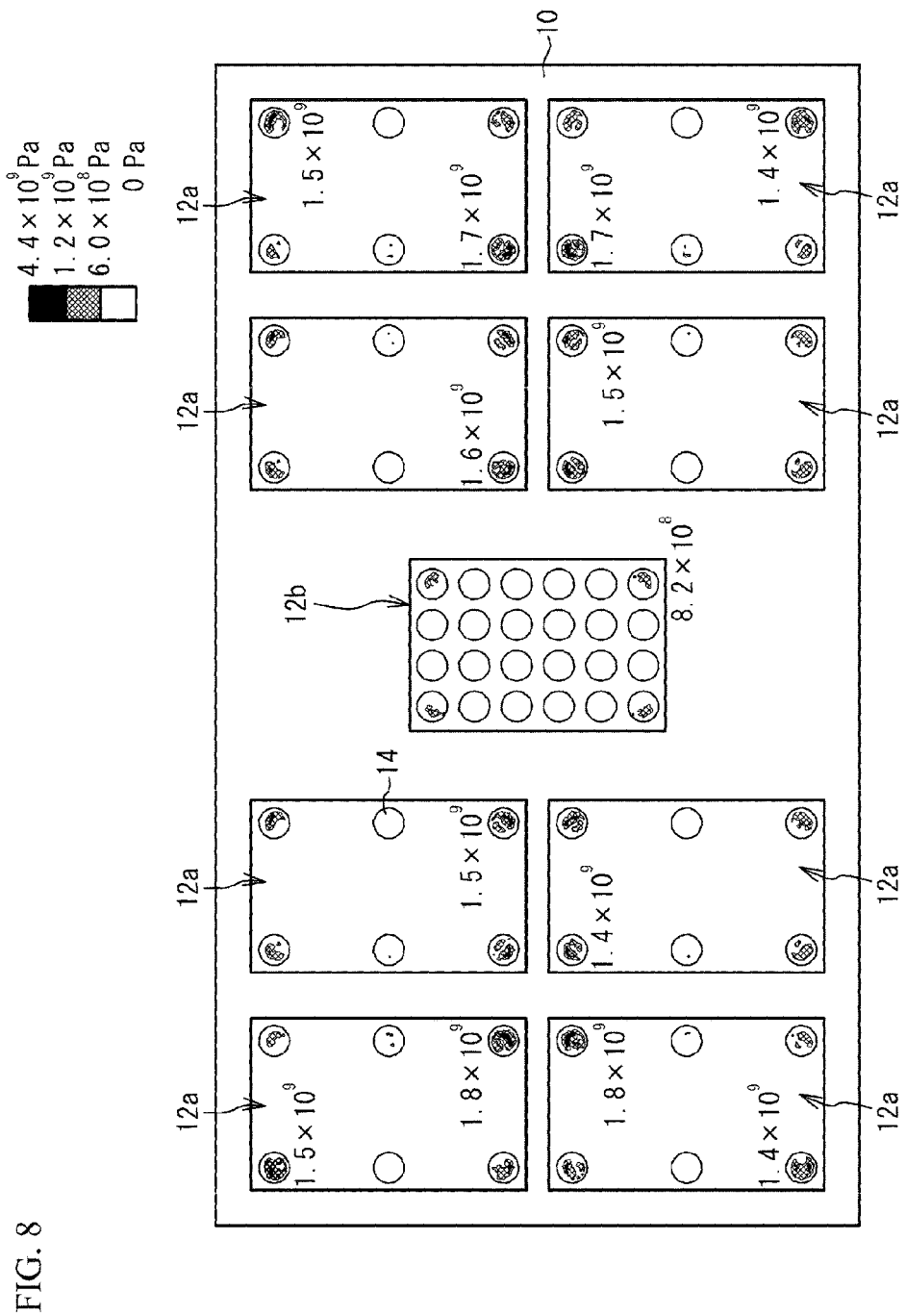
FIG. 8 is a view illustrating a result of the simulation of the electronic device according to the first embodiment.

It is assumed that such an electronic device according to the first and the second embodiment returns to a normal temperature after manufacture, and values of the stresses which arise by the bumps 14 have been calculated by the simulation. FIG. 8 illustrates a simulation result of the electronic device according to the first embodiment, and FIG. 9 illustrates a simulation result of the electronic device according to the second embodiment.

It is understood that in the first embodiment, variation occurs in the stresses applied to the bumps 14 in each of the SAW device chips 12a and the semiconductor device chip 12b, as illustrated in FIG. 8. In each of the device chips, the stresses of about $8.2 \times 10^8 - 1.8 \times 10^9$ Pa which are larger than a stress applied to the bump 14 located on another position are applied to the bumps 14 located on four corners, for example. It is considered that the reason why the variation occurs in the stresses applied to the bumps 14 in each device chip is that each device chip performs thermal expansion and contraction individually and hence each device chip is affected by thermal expansion and contraction of the wiring substrate 10 and the sealing unit 26.

Thus, in the first embodiment, the variation occurs in the stresses applied to the bumps 14 in each device chip. It is considered that, when the chip form of each device chip and the arrangement of the bumps 14 differ, a variation tendency of the stresses applied to the bumps 14 differ for each device chip. Consequently, it is difficult to control the junction reliability of the bumps 14 in the first embodiment.

Figure 9:
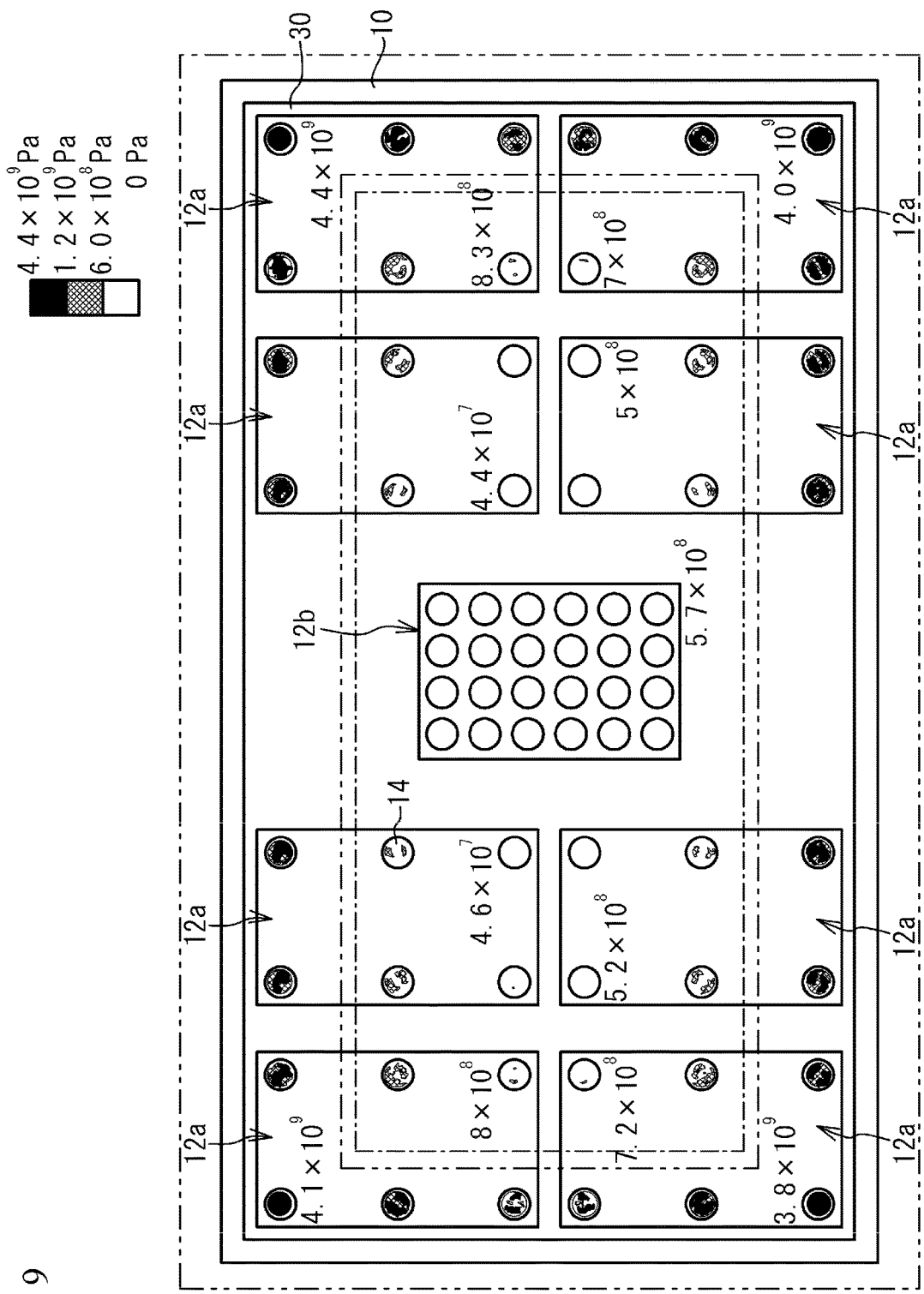
FIG. 9 is a view illustrating a result of the simulation of the electronic device according to the second embodiment.

It is understood that, in the second embodiment, the stresses applied to the bumps 14 located in a central domain surrounded with an alternate long and short dash line are small, and the variation is controlled, as illustrated in FIG. 9. Moreover, it is understood that large stresses of about $3.8-4.4 \times 10^9$ Pa are applied to the bumps 14 located in an outer circumferential domain surrounded with an alternate long and two short dashed line, for example. It is considered that the reason why such stresses occur in the bumps 14 is as follows. That is, since the junction substrate 30 is joined to the plurality of device chips, the thermal expansion and contraction of each device chip is bound to the thermal expansion and contraction of the junction substrate 30. Therefore, it is considered that the whole device chips (i.e., the junction substrate 30) are affected by the thermal expansion and contraction of the wiring substrate 10 and the sealing unit 32. Thereby, it is considered that uniform and small stresses are applied to the bumps 14 located in the central domain surrounded with the alternate long and short dash line, and large stresses applied to the bumps 14 located in the outer circumferential domain surrounded with the alternate long and two short dashed line. It is understood that, since the whole device chips (i.e., the junction substrate 30) are affected by the thermal expansion and contraction of the wiring substrate 10 and the sealing unit 32, the stresses applied to the bumps 14 can be controlled easily by controlling a size of the junction substrate 30 and a physical property, such as the thermal expansion coefficient.

Even if the large stresses are applied to the bumps 14 located in the outer circumferential domain surrounded with the alternate long and two short dashed line as illustrated in FIG. 9, these bumps 14 are pressed by the sealing unit 32 since these bumps 14 are arranged near the sealing unit 32, and hence it is controlled that the junction reliability is damaged. Moreover, since the large stresses are not applied to the bumps 14 located in the central domain surrounded with the alternate long and short dash line, it is controlled that the junction reliability about these bumps 14 is also damaged. Thus, according to the second embodiment, the junction reliability can be improved.

According to the second embodiment, the junction substrate 30 having the thermal expansion coefficient equal to or less than the thermal expansion coefficient of the piezoelectric substrate 16 is joined to the plurality of device chips 12 including the SAW device chips 12a each of which has the piezoelectric substrate 16 having the thermal expansion coefficient more than the thermal expansion coefficient of the wiring substrate 10. The sealing unit 32 which covers the junction substrate 30 and seals the plurality of device chips 12 is provided. With such configuration, the reliability about the junction of the bumps 14 can be improved, as explained by FIG. 9.

The junction substrate 30 should just have the thermal expansion coefficient equal to or less than the thermal expansion coefficient of the piezoelectric substrate 16 which is larger than that of the wiring substrate 10. However, it is desirable that the junction substrate 30 has the thermal expansion coefficient less than the thermal expansion coefficient of the piezoelectric substrate 16 from the viewpoint of improvement in reliability of the bumps 14.

Moreover, when the device chips 12 include two or more kinds of substrates having the thermal expansion coefficient more than the thermal expansion coefficient of the wiring substrate 10, the junction substrate 30 should just have the thermal expansion coefficient equal to or less than the thermal expansion coefficient of at least one of the two or more kinds of substrates. It is desirable that the junction substrate 30 has the thermal expansion coefficient equal to or less than the thermal expansion coefficients of all of the two or more kinds of substrates.

It is desirable that the junction substrate 30 has a thermal conductivity more than a thermal conductivity of a substrate of at least one device chip in the plurality of device chips 12. It is more desirable that the junction substrate 30 has a thermal conductivity more than thermal conductivities of substrates of all device chips. Thereby, heat dissipation can be improved. When the device chips 12 include the SAW device chips 12a each of which has the piezoelectric substrate 16 composed of the LT or the LN, sapphire or silicon can be used as the junction substrate 30.

It is desirable that the junction substrate 30 is larger than the domain on which the device chips 12 are provided, in order to apply the uniform and small stresses to the bumps 14 located in the central domain, and apply the large stresses to the bumps 14 located in the outer circumferential domain, as illustrated in FIG. 9.

It is desirable that the junction substrate 30 has a dielectric constant lower than the dielectric constant of the piezoelectric substrate 16 of the SAW device chip 12a. Thereby, the characteristic can be improved, as described in Japanese Patent Application Publication No. 2010-74418. When the piezoelectric substrate 16 is composed of the LT or the LN, sapphire, silicon, ceramics, or glass can be used as the junction substrate 30.

Even when the sealing unit 32 is composed of metal, such as solder, or is composed of an insulator, such as resin, the reliability about the junction of the bumps 14 can be improved. It is desirable that the sealing unit 32 is composed of the metal in consideration of airtightness and heat dissipation, as explained by the first embodiment. Moreover, it is desirable that the sealing unit 32 is composed of the solder in consideration of the airtightness, an electric shield effect, easiness of the sealing, or the like.

When the device chips 12 include the SAW device chips 12a each of which has the piezoelectric substrate 16 composed of the LT or the LN, there is concern about the junction reliability of the bumps 14 since the thermal expansion coefficient of the LT or the LN is large. Therefore, in such a case, it is desirable that the junction substrate 30 is joined to the plurality of device chips 12, as described in the second embodiment.

When the device chips 12 include the SAW device chips 12a each of which has the piezoelectric substrate 16 having the thermal expansion coefficient more than the thermal expansion coefficient of the wiring substrate 10, and the semiconductor device chip 12b which has the semiconductor substrate 18 having the thermal expansion coefficient less than the thermal expansion coefficient of the wiring substrate 10, it is desirable that a material having the thermal expansion coefficient which is equal to or less than the thermal expansion coefficient of the piezoelectric substrate 16 and equal to or more than the thermal expansion coefficient of the semiconductor substrate 18 is selected as the material of the junction substrate 30.

Third Embodiment

Figure 10A:
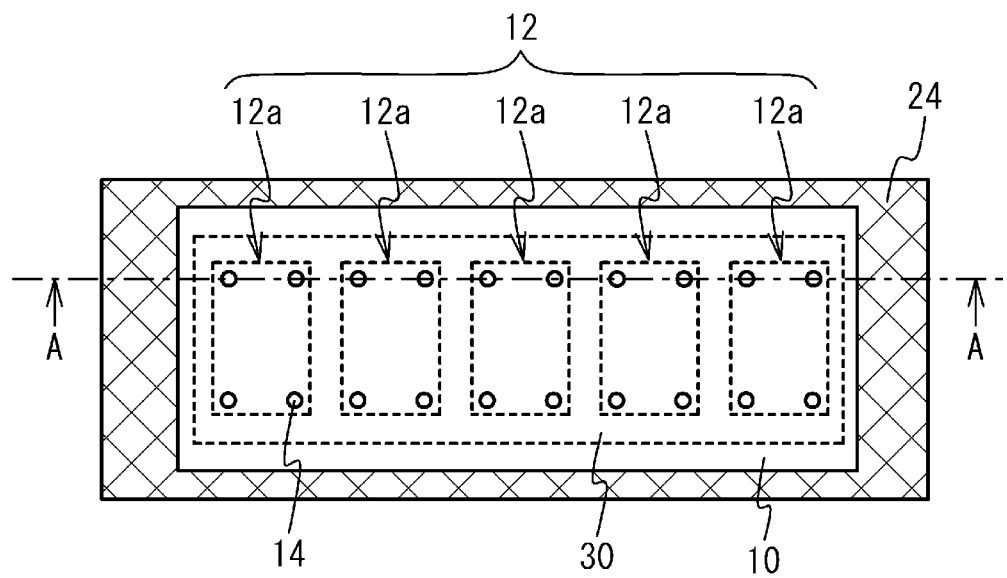
FIG. 10A is a top view illustrating an electronic device according to a third embodiment.
Figure 10B:
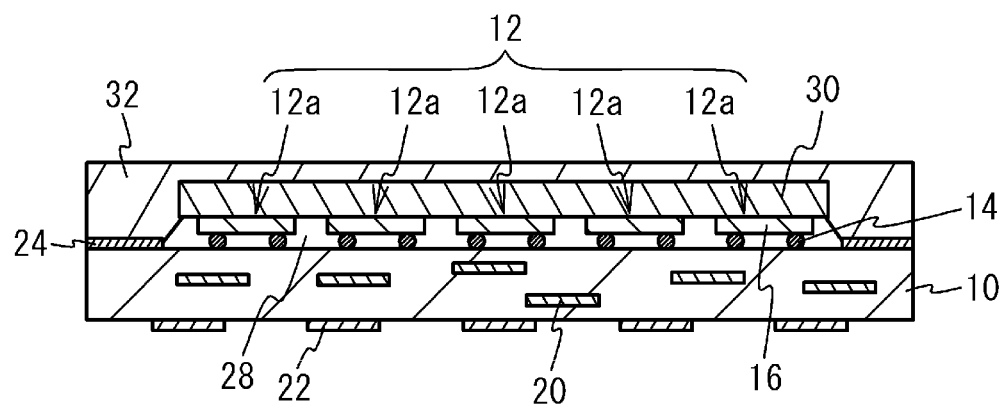
FIG. 10B is a cross-sectional view taken along a line A-A in FIG. 10A.

FIG. 10A is a top view illustrating an electronic device according to a third embodiment. FIG. 10B is a cross-sectional view taken along a line A-A in FIG. 10A. In FIG. 10A, the bumps 14 are illustrated by penetrating the sealing unit 32, the junction substrate 30, and the plurality of device chips 12. As illustrated in FIGS. 10A and 10B, the plurality of device chips 12 may include only the SAW device chips 12a without including the semiconductor device chip 12b.

Figure 11A:
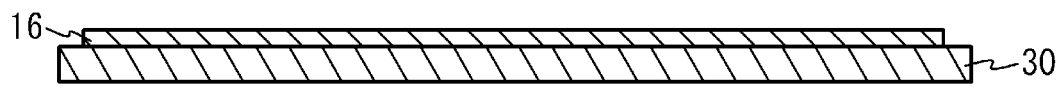
FIGS. 11A to 11D are cross-sectional views illustrating a manufacturing method of the electronic device according to the third embodiment.

FIGS. 11A to 11D are cross-sectional views illustrating a manufacturing method of the electronic device according to the third embodiment. As illustrated in FIG. 11A, the piezoelectric substrate 16 is joined to one surface of the junction substrate 30. Then, a metal film (not shown) of the SAW device chips, such as the IDT, is formed on the upper surface of the piezoelectric substrate 16.

Figure 11B:
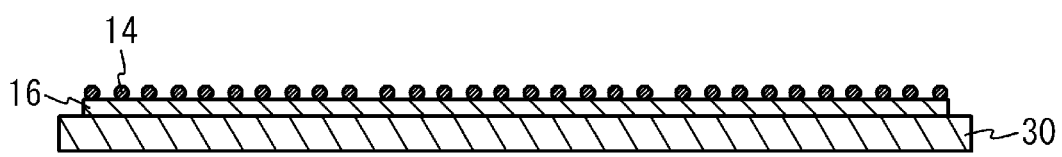
Figure 11C:
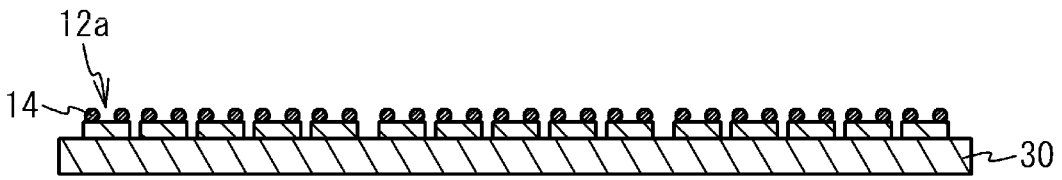
Figure 11D:
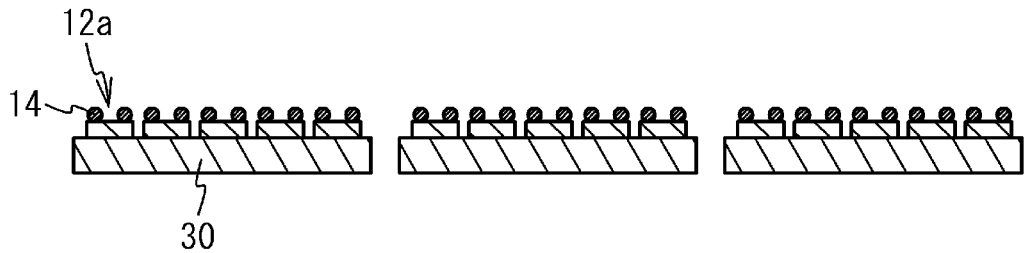

As illustrated in FIG. 11B, the bumps 14 are formed on the upper surface of the piezoelectric substrate 16. As illustrated in FIG. 11C, the piezoelectric substrate 16 is cut and separated into the SAW device chips 12a, respectively. As illustrated in FIG. 11D, the junction substrate 30 is divided into desired units. Then, the manufacturing process explained by FIGS. 4C and 4D is performed. The electronic device according to the third embodiment can be formed by including such a manufacturing process.

The third embodiment explains the case where, in the electronic device of the second embodiment, the plurality of device chips 12 include only the SAW device chips 12a. Also in the electronic device of the first embodiment, the plurality of device chips 12 may include only the acoustic wave device chips.

Figure 12:
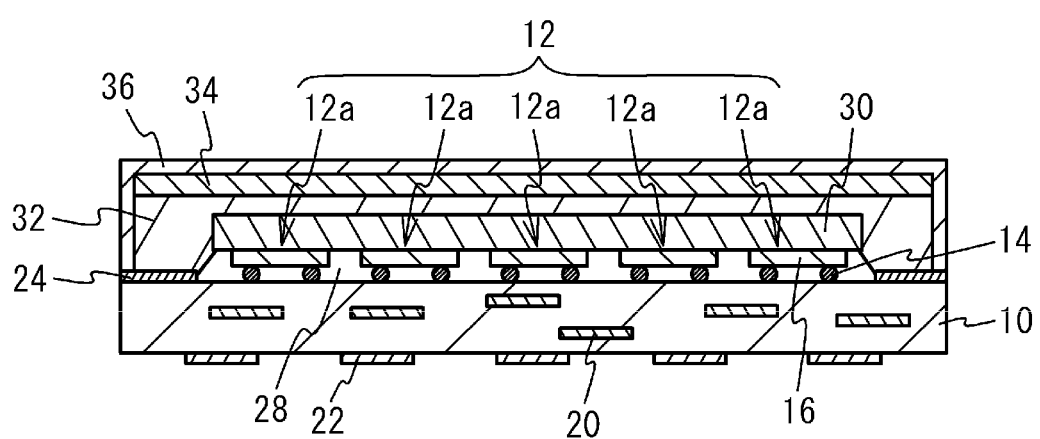
FIG. 12 is a cross-sectional view illustrating an electronic device according to a first variation example of the third embodiment.

FIG. 12 is a cross-sectional view illustrating an electronic device according to a first variation example of the third embodiment. As illustrated in FIG. 12, a top plate 34 composed of Kovar, for example, may be provided on the sealing unit 32, and a nickel (Ni) film 36 may be provided to cover the sealing unit 32 and the top plate 34. Similarly, the top plate 34 and the nickel film 36 may be also provided in the first and the second embodiments.

Although the embodiments of the present invention have been described in detail, it is to be understood that the various change, substitutions, and alterations could be made hereto without departing from the spirit and scope of the invention.

What is claimed is:

1. An electronic device comprising:
a wiring substrate;
a plurality of device chips that are flip-chip mounted on an upper surface of the wiring substrate through bumps, have air gaps which expose the bumps between the device chips and the upper surface of the wiring substrate, and include at least one device chip that has a substrate having a thermal expansion coefficient more than a thermal expansion coefficient of the wiring substrate;
a single junction substrate that is joined to the plurality of device chips, and has a thermal expansion coefficient equal to or less than the thermal expansion coefficient of the substrate included in the at least one device chip; and
a sealer that covers the junction substrate, and seals the plurality of device chips,
wherein respective top surfaces of all of the plurality of device chips that have been flip-chip mounted on the wiring substrate are in direct contact with a bottom surface of the single junction substrate, and
wherein the sealer is not provided between the plurality of device chips.

2. The electronic device according to claim 1, wherein the junction substrate has a thermal conductivity more than a thermal conductivity of a substrate of at least one device chip in the plurality of device chips.

3. The electronic device according to claim 1, wherein the junction substrate is larger than a domain on which the plurality of device chips are provided.

4. The electronic device according to claim 1, wherein the sealer is composed of a metal.

5. The electronic device according to claim 1, wherein the plurality of device chips include a surface acoustic wave device chip that includes a piezoelectric substrate composed of lithium tantalite or lithium niobate.

6. The electronic device according to claim 4, wherein the sealer is composed of solder.

7. The electronic device according to claim 1, wherein the wiring substrate is composed of ceramic.

8. The electronic device according to claim 1, wherein the single junction substrate is jointed to the plurality of device chips so as to cover the respective top surfaces of the plurality of device chips in entirety as seen in a plan view.

9. The electronic device according to claim 8, wherein the sealer is in contact with side surfaces of the single junction substrate which do not overlap with the plurality of device chips.

10. The electronic device according to claim 9, wherein the sealer is not in contact with any side surfaces of the plurality of device chips.

11. The electronic device according to claim 9, wherein the sealer is in contact with an upper surface and side surfaces of the single junction substrate, and is not in contact with all of the plurality of device chips.

* * * * *